United States Patent
Wang et al.

(10) Patent No.: US 12,424,442 B2
(45) Date of Patent: Sep. 23, 2025

(54) METHODS FOR FORMING SEMICONDUCTOR DEVICES USING MODIFIED PHOTOMASK LAYER

(71) Applicant: Tokyo Electron Limited, Tokyo (JP)

(72) Inventors: Peng Wang, Albany, NY (US); Emilia Hirsch, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 306 days.

(21) Appl. No.: 18/090,436

(22) Filed: Dec. 28, 2022

(65) Prior Publication Data
US 2024/0222118 A1    Jul. 4, 2024

(51) Int. Cl.
| | |
|---|---|
| H01L 21/027 | (2006.01) |
| H01J 37/32 | (2006.01) |
| H01L 21/02 | (2006.01) |
| H01L 21/033 | (2006.01) |
| H01L 21/67 | (2006.01) |
| H01L 21/768 | (2006.01) |

(52) U.S. Cl.
CPC ...... *H01L 21/0273* (2013.01); *H01J 37/3255* (2013.01); *H01J 37/32577* (2013.01); *H01L 21/02123* (2013.01); *H01L 21/02266* (2013.01); *H01L 21/0337* (2013.01); *H01L 21/67017* (2013.01); *H01L 21/76877* (2013.01)

(58) Field of Classification Search
None
See application file for complete search history.

(56) References Cited

U.S. PATENT DOCUMENTS

| | | | |
|---|---|---|---|
| 6,664,191 B1 | 12/2003 | Kim et al. | |
| 8,883,648 B1 * | 11/2014 | Hsieh | H01L 21/31144 438/689 |
| 2003/0162395 A1 | 8/2003 | Trapp | |
| 2018/0151333 A1 * | 5/2018 | Katsunuma | H01J 37/32366 |
| 2019/0080959 A1 * | 3/2019 | Chang | H01L 21/31111 |
| 2021/0183656 A1 * | 6/2021 | Lutker-Lee | H01L 21/0337 |
| 2022/0375759 A1 * | 11/2022 | Kim | H01J 37/32834 |
| 2023/0018394 A1 * | 1/2023 | Makala | H10D 62/115 |
| 2023/0162987 A1 * | 5/2023 | Xie | H01L 21/3065 438/211 |
| 2023/0317462 A1 * | 10/2023 | Han | H10D 84/038 438/689 |
| 2024/0162042 A1 * | 5/2024 | Guo | H01L 21/30655 |

FOREIGN PATENT DOCUMENTS

KR    20020050591 A    6/2002

OTHER PUBLICATIONS

International Search Report and Written Opinion on PCT App. PCT/US2023/037046 dated Apr. 2, 2024 (9 pages).

* cited by examiner

*Primary Examiner* — Binh X Tran
(74) *Attorney, Agent, or Firm* — Foley & Lardner LLP

(57) ABSTRACT

A method for manufacturing semiconductor devices is disclosed. The method includes forming a photomask layer disposed on a dielectric material, wherein the photomask layer comprises a polymer layer. The method includes partially etching the polymer layer to form a first opening. The method includes overlaying partial sidewalls of the first opening with a first silicon layer. The method includes further etching the polymer layer, with the first silicon layer serving as a mask, to extend the first opening to form a second opening.

20 Claims, 9 Drawing Sheets

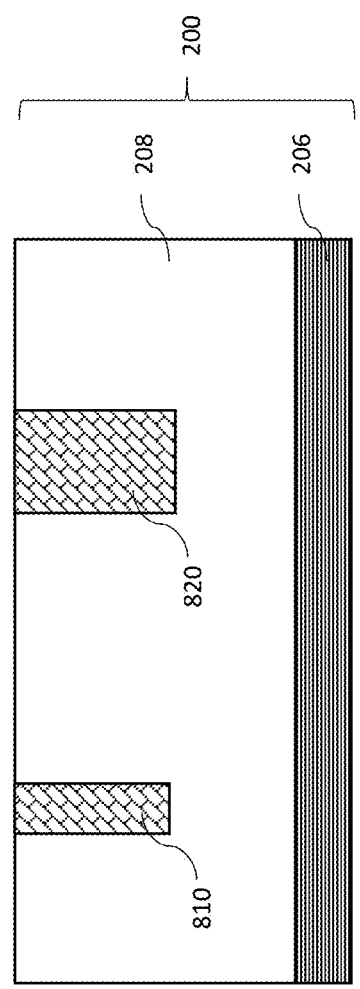
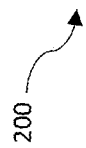
FIG. 8

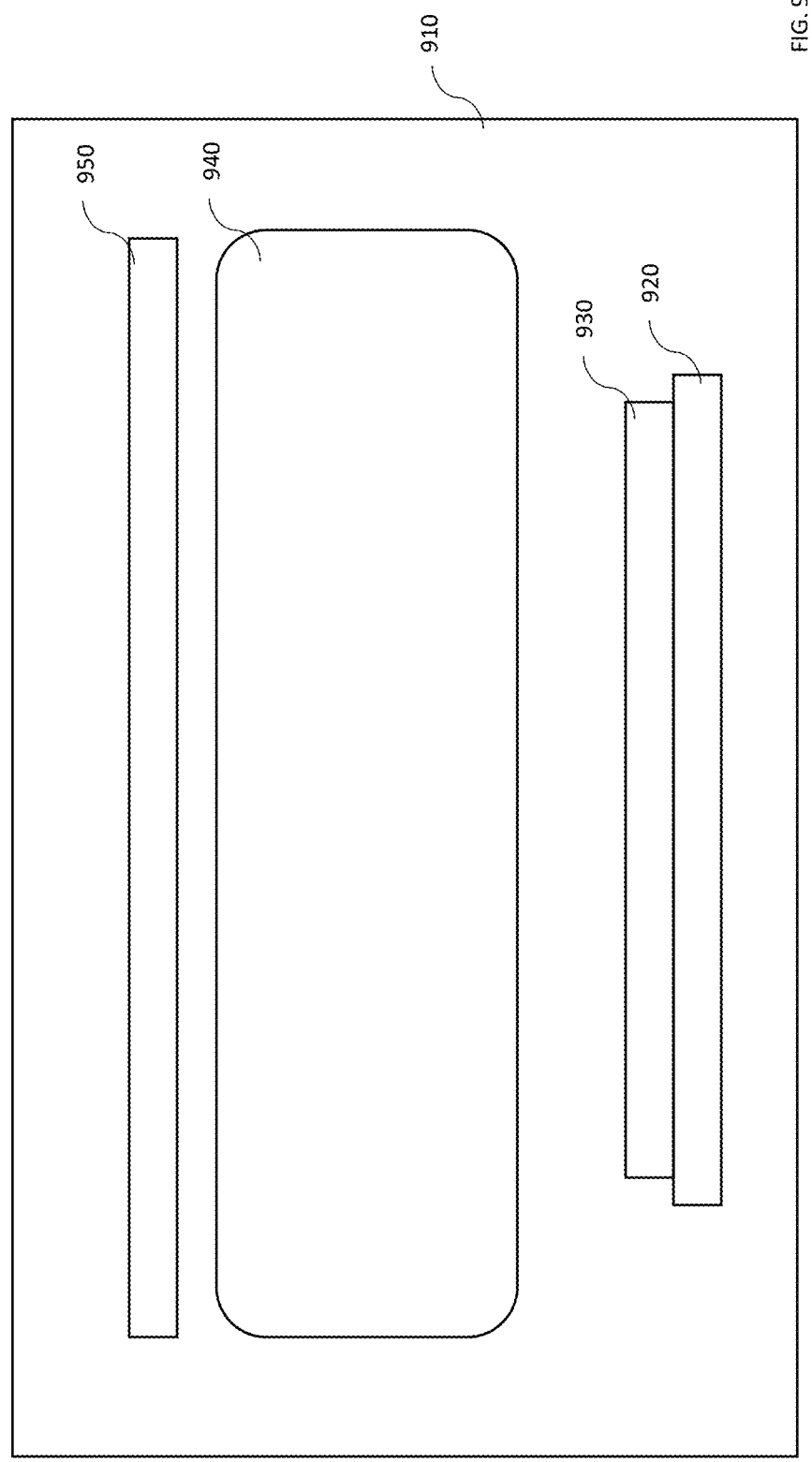

METHODS FOR FORMING SEMICONDUCTOR DEVICES USING MODIFIED PHOTOMASK LAYER

TECHNICAL FIELD

This disclosure relates generally to photomask layers for semiconductor processing and in particular to photomask layers for manufacturing semiconductor devices with different aspect ratio geometries.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

SUMMARY

At least one aspect of the present disclosure is directed to a method for manufacturing semiconductor devices. The method includes forming a photomask layer disposed on a dielectric material, wherein the photomask layer comprises a polymer layer. The method includes partially etching the polymer layer to form a first opening. The method includes overlaying sidewalls of the first opening with a first silicon layer. The method includes further etching the polymer layer, with the first silicon layer serving as a mask, to extend the first opening to form a second opening.

In some embodiments, the step of overlaying sidewalls of the first opening with a first silicon layer further comprises sputtering, through plasma, an electrode of a chamber to generate a plurality of sputtered silicon atoms; and re-depositing at least some of the plurality of sputtered silicon atoms over the first opening to form the first silicon layer. The plasma includes argon plasma. The electrode comprises silicon. The electrode is electrically connected to a DC bias.

In some embodiments, the method further includes partially etching the polymer layer to form a third opening; overlaying sidewalls of the third opening with a second silicon layer, wherein the first silicon layer has a first thickness while the second silicon layer has a second, different thickness; and further etching the polymer layer, with the second silicon layer serving as a mask, to extend the third opening to form a fourth opening. The first opening has a first width and the third opening has a second width, the first width being greater than the second width. The first thickness is greater than the second thickness.

The method further includes etching the dielectric material through the second opening; and removing respective remaining portions of the photomask layer and the first silicon layer.

At least another aspect of the present disclosure is directed to a method for manufacturing semiconductor devices. The method includes forming a photomask layer disposed on a dielectric material, wherein the photomask layer comprises a polymer layer; partially etching the polymer layer to form a first opening and a second opening, wherein the first opening has a first width while the second opening has a second width different than the first width; overlaying partial sidewalls of the first opening and partial sidewalls of the second opening with a first silicon layer and a second silicon layer, respectively, wherein the first silicon layer has a first thickness while the second silicon layer has a second thickness different than the first thickness; and further etching the polymer layer, with the first and second silicon layers serving as respective masks, to extend the first opening to form a third opening and extend the second opening to form a fourth opening.

In some embodiments, the step of overlaying partial sidewalls of the first opening and partial sidewalls of the second opening with a first silicon layer and a second silicon layer, respectively comprises sputtering, through plasma, an electrode of a chamber to generate a plurality of sputtered silicon atoms; and re-depositing at least some of the plurality of sputtered silicon atoms over the first opening and the second opening to form the first silicon layer and the second silicon layer, respectively. The electrode comprises silicon. The electrode is electrically connected to a DC bias.

In some embodiments, the step of overlaying partial sidewalls of the first opening and partial sidewalls of the second opening with a first silicon layer and a second silicon layer, respectively comprises a Physical Vapor Deposition (PVD)-like process.

In some embodiments, the first width is wider than the second width, which causes the first thickness to be thicker than the second thickness.

In some embodiments, the method further includes etching the dielectric material through the third opening and fourth opening to form a first trench and a second trench, respectively; and removing respective remaining portions of the photomask layer, the first silicon layer, and the second silicon layer. The method further includes filling the first trench and second trench with a metal material to form a first interconnect structure and a second interconnect structure, respectively.

Yet another aspect of the present disclosure is directed to a semiconductor fabrication apparatus. The apparatus includes a chamber configured to house a semiconductor device comprising a dielectric layer overlaid by a photomask layer, wherein the photomask layer comprises a polymer layer; and an electrode comprising silicon. The chamber is configured to contain plasma that sputters the electrode to generate a plurality of silicon atoms so as to re-deposit the plurality of silicon atoms over an opening partially extending through the polymer layer.

In some embodiments, the plurality of silicon atoms form a silicon layer extending along upper portions of sidewalls of the opening.

In some embodiments, the electrode is electrically connected to a DC bias.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings:

FIGS. 2 to 8 illustrate respective cross-sectional views of a semiconductor device during various fabrication stages, made by the method of FIG. 1, in accordance with some embodiments.

FIG. 9 illustrates an example apparatus configured to form at least a portion of the semiconductor device shown in FIGS. 2 to 8, in accordance with some embodiments.

DETAILED DESCRIPTION

Figure 1:
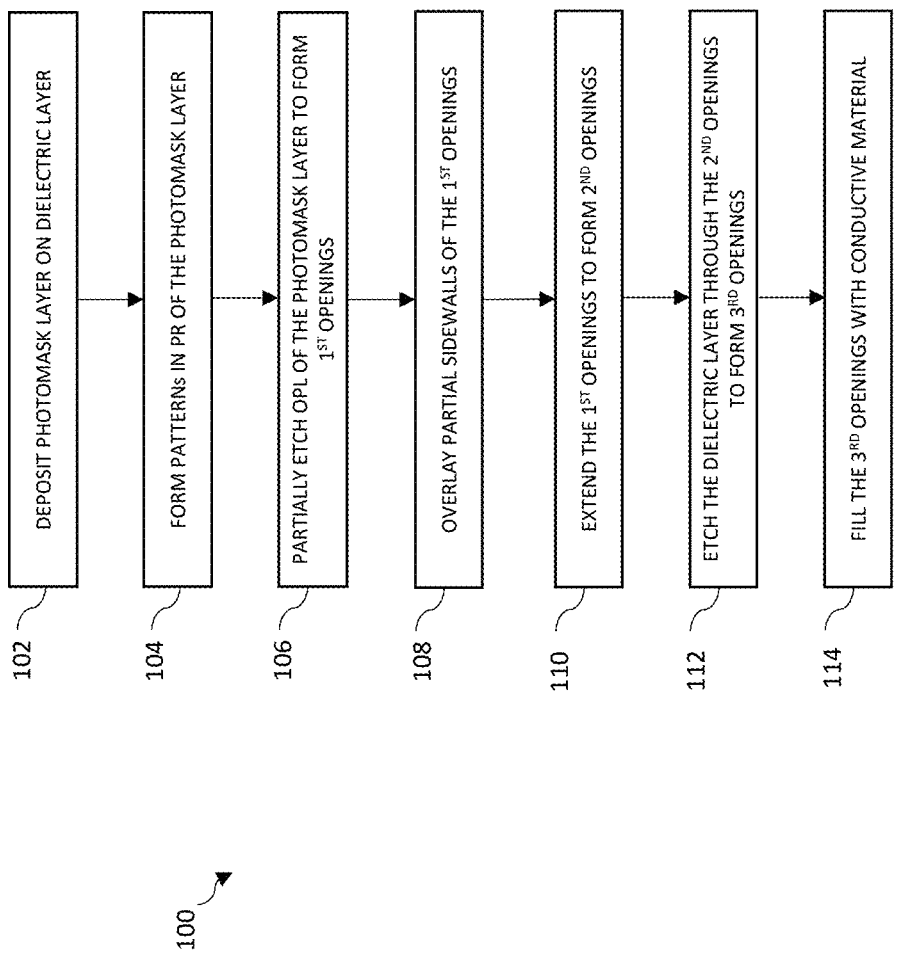
FIG. 1 illustrates a flow chart of an example method for making a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

The decreasing geometry sizes (sometimes referred to as a "critical dimensions" (CDs)) may lead to various manufacturing difficulties. For example, a tri-layer photomask layer is commonly used to pattern layers in semiconductor processes. However, as the device sizes become smaller and smaller, the sole use of tri-layer photoresist may require some trade-off, which may degrade semiconductor device performance or even lead to device failures. As the number of features with different CDs formed on a single substrate increases, forming features with a smaller CD generally causes features with a larger CD to suffer; and vice versa. For example, to form a feature with the smaller CD, etching conditions need to be moderated, while such moderated etching conditions may cause a feature with the larger CD to be incompletely formed. Such an issue is sometimes referred to as compromised local CD uniformity. Thus, while existing methods of patterning semiconductor devices have been generally adequate for their intended purposes, they have not been entirely satisfactory in some aspects.

FIG. 1 illustrates a flow chart of an example method 100 for the formation of a semiconductor device using a modified photomask layer, in accordance with various embodiments. FIGS. 2-8 are cross-sectional views of such a semiconductor device 200 describing some of the major operations described in the method 100 of FIG. 1. For example, a feature (e.g., an opening) with a high aspect ratio is formed (e.g., etched) into one or more dielectric layers disposed on a semiconductor substrate. Such a high aspect ratio opening can be in rectangular, square, circular (as in contacts) or any other regular or irregular shape. The high aspect ratio opening can be a trenches or a hole, in various embodiments.

Figure 2:
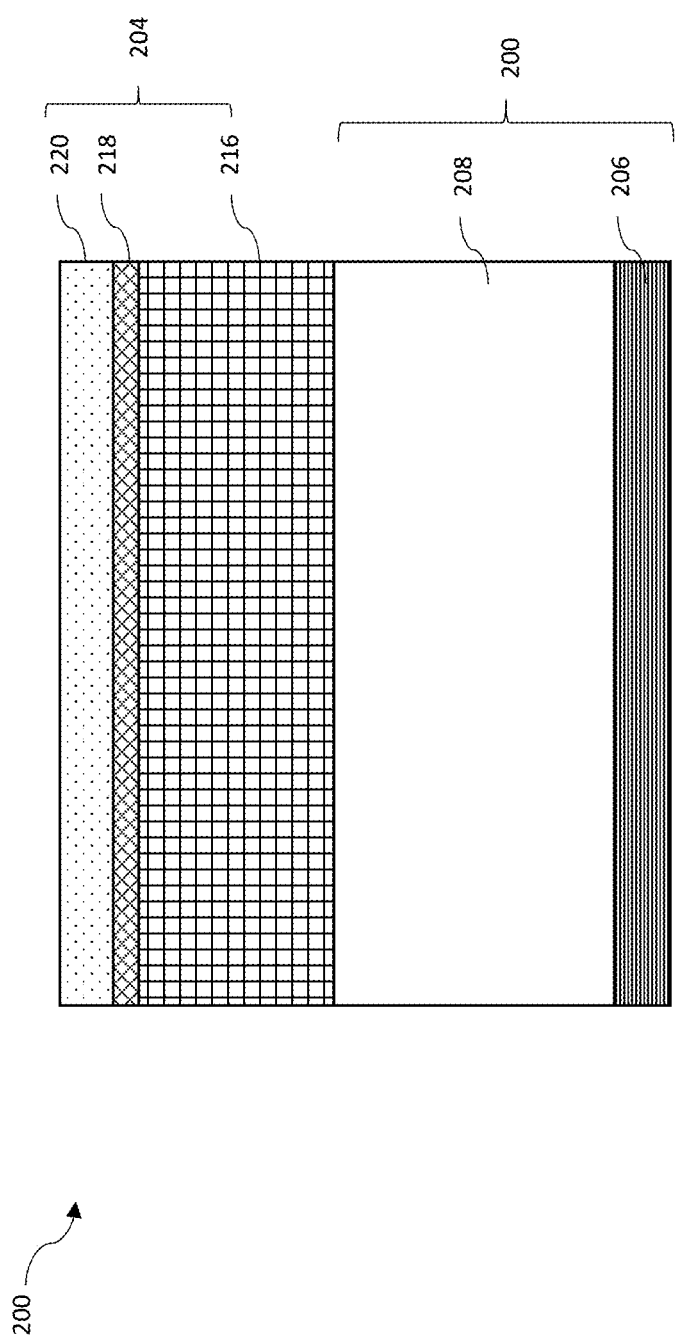

Referring to operation 102 in FIG. 1 and to the cross-sectional view in FIG. 2, a photomask layer 204 is deposited on a substrate 200. The substrate 200 may comprise a semiconductor substrate 206 with an overlying dielectric layer 208. Although the dielectric layer 208 is shown as a single layer, it should be understood that the dielectric layer 208 can include a plural number of layers stacked on top of one another. Further, interposed between the semiconductor substrate 206 and the dielectric layer 208, an etch stop layer (not shown) may be formed.

In various embodiments, the semiconductor substrate 206 may be a single crystal semiconductor substrate such as a single crystal silicon wafer or a silicon-on-insulator substrate. As mentioned above, in some embodiments, the dielectric layer 208 may include one or more dielectrics layers, each of which is formed of silicon oxide or otherwise insulation materials (e.g., low-k dielectric materials). The low-k dielectric material is a material having a dielectric constant less than that of standard silicon dioxide (dielectric constant of silicon oxide is about 3.9). For example, the low-k dielectric material may include, but is not limited to, fluorine-doped silicon dioxide, carbon-doped silicon dioxide, porous silicon dioxide, porous carbon-doped silicon dioxide, spin-on organic polymeric dielectrics, spin-on silicone based polymeric dielectric, polyimides, aromatic polymers, fluorine-doped amorphous carbon, vapor-deposited parylene, etc. In some other embodiments, the dielectric layer 208 may include a plurality of alternately stacked first dielectric layers and second dielectric layers, where the first dielectric layers each have silicon dioxide and the second dielectric layers each have silicon nitride or silicon oxynitride. With such embodiments, the nitride-based second dielectric layers may later be replaced with metal layers, while the oxide-based first dielectric layers may serve as isolation layers between those metal layers.

The photomask layer 204 can be a tri-layer photomask (as shown in the example of FIG. 2) having a bottom organic layer 216, a middle antireflective coat layer 218, and a top photoresist layer 220, stacked on top of one another. For example, a material of the bottom organic layer 216 may include a plurality of monomers or polymers that are not cross-linked. A material of the middle antireflective coat layer 218 may include silicon-containing inorganic polymer. The top photoresist layer (e.g., 220) may include a photosensitive element, such as a photo-acid generator (PAG), which allows a photolithography process to be performed to pattern the top photoresist layer. The pattern from the photoresist layer can then be transferred to the layers 218 and 216 which act as an etch mask for subsequently etching the underlying layer, e.g., 208. However, it should be understood that the photomask layer 204 can include any suitable single layer or any number of stacked layers, while remaining within the scope of the present disclosure. For example, the photomask layer 204 may be a bi-layer photomask, which has a bottom antireflective coat layer and a top photoresist layer.

Figure 3:
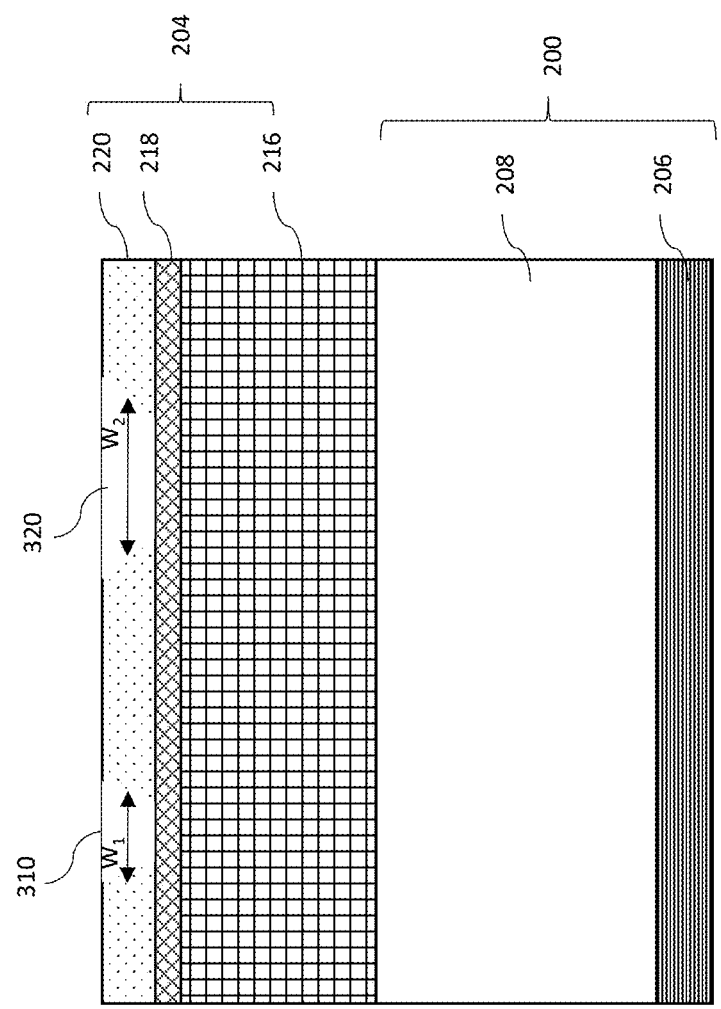

Referring to operation 104 in FIG. 1 and to the cross-sectional view in FIG. 3, a number of patterns, e.g., 310 and 320, are formed in the top photoresist layer 220 of the photomask layer 204. Upon forming the top photoresist layer 220, a photolithography process is performed on the top photoresist layer 220 to form the patterns 310 and 320, each of which may extend through the top photoresist layer 220. In some embodiments, the patterns 310 and 320 can have respectively different widths, e.g., $W_1$ and $W_2$. The photolithography process may include exposing the workpiece to a radiation beam. The radiation beam may expose the top photoresist layer 220 using a lithography system that provides a pattern of the radiation according to an IC design layout. In one embodiment, a lithography system includes an ultraviolet (UV) radiation, a deep ultraviolet (DUV) radiation, an extreme ultraviolet (EUV) radiation, an X-ray radiation, and/or other suitable radiation types. In alternative embodiments, a lithography system includes a charged particle lithography system, such as an electron beam or an ion beam lithography system.

Figure 4:
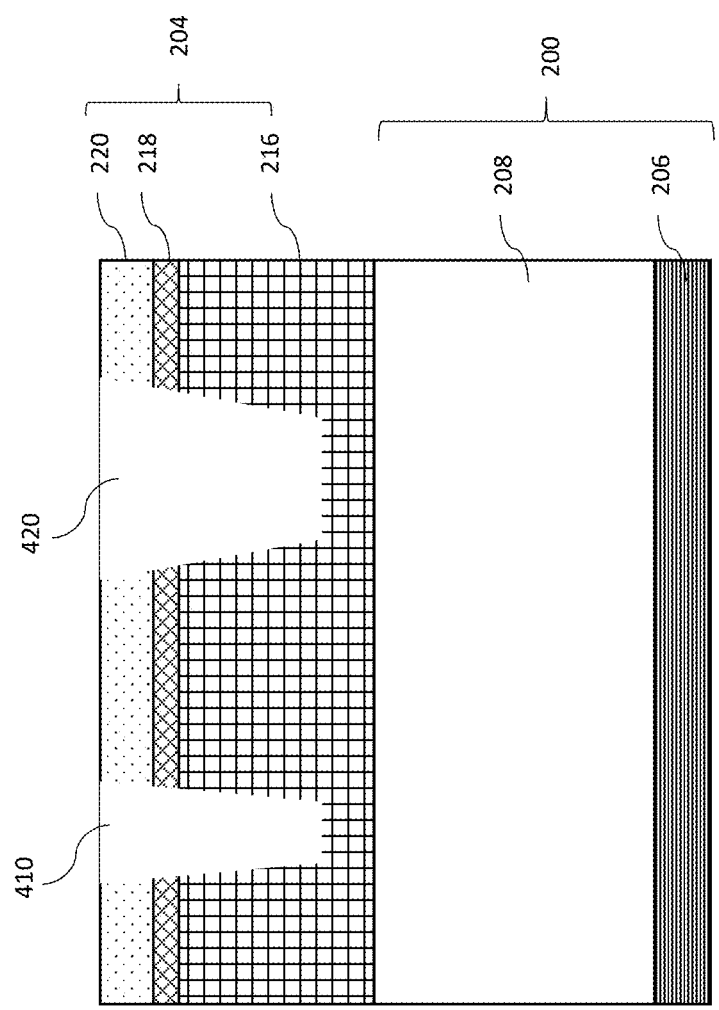

Referring to operation 106 in FIG. 1 and to the cross-sectional view in FIG. 4, a number of first openings, e.g., 410 and 420, are formed in the bottom organic layer 216 of the photomask layer 204. As shown, the first openings 410 and 420 are formed by transferring or otherwise extending the patterns 310 and 320 to the bottom organic layer 216, respectively. In some embodiments, the first openings 410 and 420 may not extend through the bottom organic layer 216, as shown in FIG. 4. Stated another way, each of the first openings 410 and 420 has a bottom surface formed of a corresponding remaining portion of the bottom organic layer 216. As the patterns 310 and 320 are transferred to the first openings 410 and 420, the first openings 410 and 420 may also have respectively different widths.

The first openings 410 and 420 can be formed by an etching process to "open" the bottom organic layer 216. An etching gas of the etching process includes HBr, $Cl_2$, $O_2$, and $N_2$. The HBr gas may have a flow rate in a range from about 40 sccm to about 60 sccm, for example about 50 sccm, the $Cl_2$ gas may have a flow rate in a range from about 5 sccm to about 40 sccm, for example about 20 sccm, the $O_2$ gas may have a flow rate in a range from about 40 sccm to about 150 sccm, for example about 90 sccm, and the $N_2$ gas may have a flow rate in a range from about 30 sccm to about 80 sccm, for example about 50 sccm.

Figure 5:
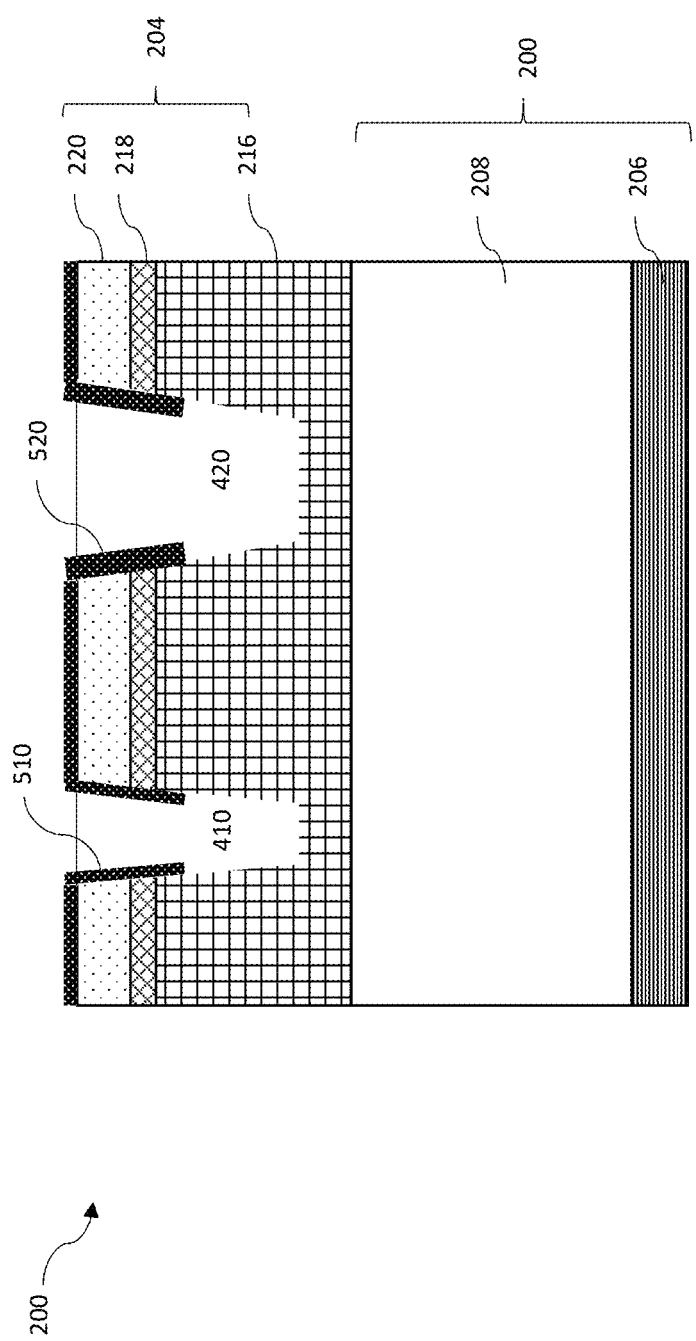

Referring to operation 108 in FIG. 1 and to the cross-sectional view in FIG. 5, the first openings 410 and 420 are partially overlaid by silicon layers 510 and 520, respectively. In some embodiments, the silicon layers 510 and 520 may be formed by a Physical Vapor Deposition (PVD)-like process, which may sometimes be referred to as a non-conformal deposition process. Given the non-conformal characteristic, the silicon layers 510 and 520 may be formed as having respectively different thickness. For example, the silicon layer 510 formed in the first opening 410 may have a thinner thickness; and the silicon layer 520 formed in the first opening 420 may have a thicker thickness. Further, in some embodiments, the silicon layer 510 may only partially extend along upper sidewalls of the first opening 410; and the silicon layer 520 may only partially extend along upper sidewalls of the first opening 420.

Figure 6:
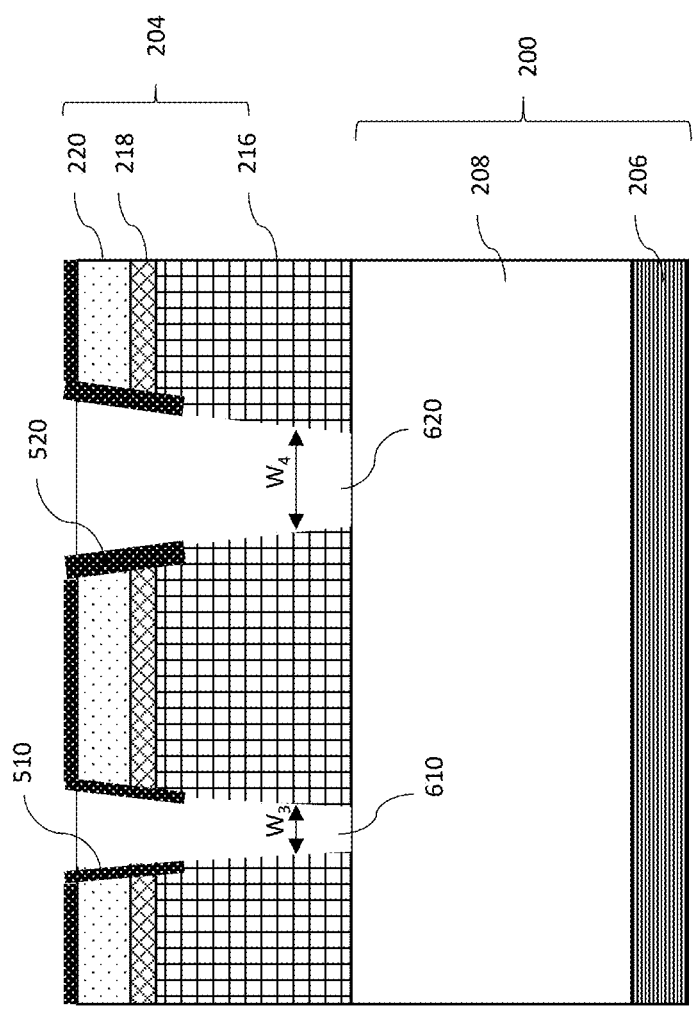

Referring to operation 110 in FIG. 1 and to the cross-sectional view in FIG. 6, a number of second openings, e.g., 610 and 620, are formed by extending the first openings 410 and 420, respectively. Upon forming the silicon layers 510 and 520, they may serve as "additional" masks to etch the bottom organic layer 216 so as form the second openings 610 and 620, respectively. Specifically, the second openings 610 and 620 may be formed by an etching process to etch remaining portions of the bottom organic layer 216 that are below the first openings 410 and 420 (FIG. 5), respectively. An etching gas of the etching process includes HBr, $Cl_2$, $O_2$, and $N_2$. The HBr gas may have a flow rate in a range from about 40 sccm to about 60 sccm, for example about 50 sccm, the $Cl_2$ gas may have a flow rate in a range from about 5 sccm to about 40 sccm, for example about 20 sccm, the $O_2$ gas may have a flow rate in a range from about 40 sccm to about 150 sccm, for example about 90 sccm, and the $N_2$ gas may have a flow rate in a range from about 30 sccm to about 80 sccm, for example about 50 sccm.

In some embodiments, with the silicon layers 510 and 520 extending along upper sidewalls of the first openings 410 and 420, respectively, a difference between the patterns 310 and 320 originally formed in the top photoresist layer 220 (i.e., $W_1$-$W_2$) can be advantageously reduced. For example, with the silicon layers 510 and 520 serving as the masks for the first openings 410 and 420, when extending the first openings 410 and 420 to form the second openings 610 and 620, respectively, a difference between widths of the second openings 610 and 620 (i.e., $W_3$-$W_4$) is smaller when compared to the difference between $W_1$ and $W_2$. Further, with the silicon layer 510 present in the smaller first opening 410, an over-etch margin can be advantageously increased, which allows a more amount of the over-etching to be performed over the larger first opening 420 while simultaneously keeping the original CD of the smaller first opening 410. In other words, even though an additional amount of the over-etching is performed (which can assure the bigger second opening 620 to be formed), an original dimension (e.g., $W_1$) of the smaller first opening 410 will not be overly exaggerated, i.e., $W_3$ can be finely controlled to be substantially close to $W_1$.

Figure 7:
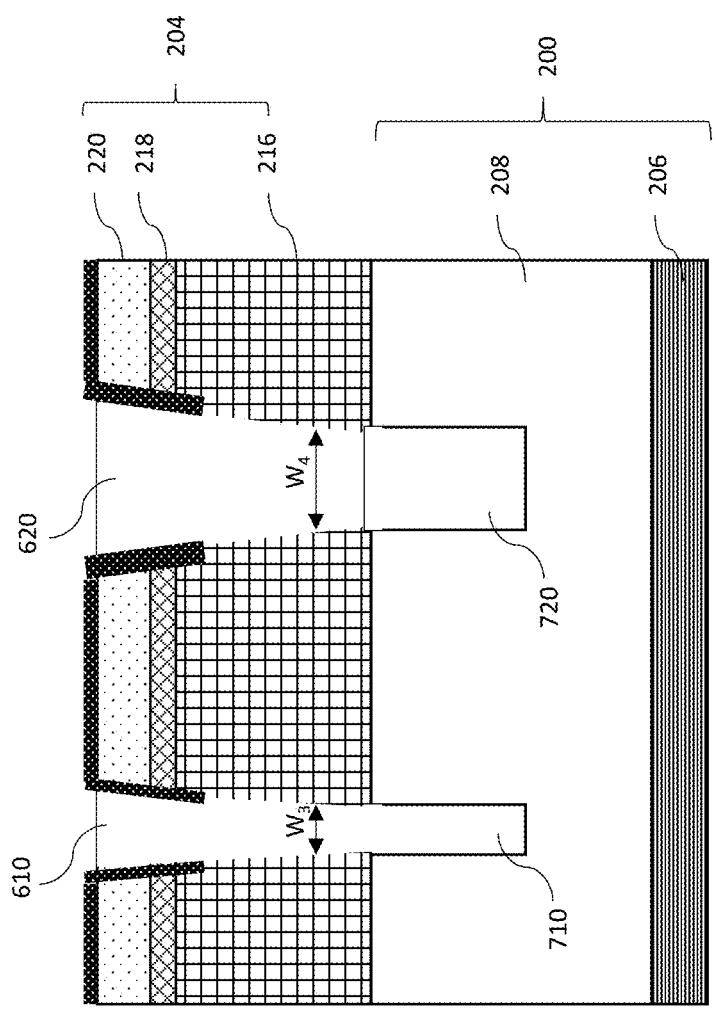

Referring to operation 112 in FIG. 1 and to the cross-sectional view in FIG. 7, a number of third openings, e.g., 710 and 720, are formed in the dielectric layer 208 by extending the second openings 610 and 620, respectively. In some embodiments, the third openings 710 and 720 may be formed by an etching process to etch the dielectric layer 208, with the remaining portions of the photomask layer 204 serving as a mask. An etching gas of the etching process includes $CF_4$, $CHF_3$, $H_2$, $N_2$, and Ar. The $CHF_3$ gas serves as a main gas in the present embodiment, and the $N_2$ and Ar gases serve as assistant gases in the present embodiment. The $CF_4$ gas may have a flow rate in a range from about 50 sccm to about 70 sccm, for example about 60 sccm, the $CHF_3$ gas may have a flow rate in a range from about 45 sccm to about 65 sccm, for example about 55 sccm, the $H_2$ gas may have a flow rate in a range from about 50 sccm to about 250 sccm, for example about 150 sccm, the $N_2$ gas may have a flow rate in a range from about 50 sccm to about 80 sccm, for example about 65 sccm, and the Ar gas may have a flow rate in a range from about 40 sccm to about 60 sccm, for example about 50 sccm. Upon forming the third openings 710 and 720, the remaining portions of the photomask layer 204 (including the silicon layers 510 and 520) may be removed from the workpiece.

Referring to operation 114 in FIG. 1 and to the cross-sectional view in FIG. 8, a number of interconnect structures, e.g., 810 and 820, are formed by filling the third openings 710 and 720, respectively, with a conductive material. In some embodiments, the third openings 710 and 720 may each include at least one of a trench or a via opening. The conductive material may include a barrier layer, a seed layer, a liner, or multiple layers or combinations thereof, for example, not shown. A fill material such as copper, a copper alloy, aluminum, an aluminum alloy, the like, or a combination thereof may be formed over the layers/liner using an electro-chemical plating (ECP) method and/or other deposition method. A chemical-mechanical polish (CMP) process and/or etch process may be used to remove excess conductive material from over the top surface of the patterned dielectric layer 208, forming the interconnect structures 810 and 820 in the patterned dielectric layer 208.

In various embodiments, the silicon layers 510 and 520 may be formed by an apparatus 900, shown in FIG. 9. As shown, the apparatus 900 includes a chamber 910, which can house a stage 920 configured to place a workpiece 930 (e.g., the semiconductor device 200 discussed above), and one or more electrodes 950. In some embodiments, the electrode 950 is disposed over a top side of the workpiece 930, i.e., with its bottom side facing the stage 920, the electrode 950 is disposed opposite the workpiece 930 from the stage 920. However, it should be understood that the electrode 950 can be disposed in any position within the chamber 910. Further, the chamber 950 can include any number of various other electrodes, while remaining within the scope of the present disclosure. In some embodiments, the electrode 950 is made of silicon atoms, or having at least a surface facing the workpiece that is made of silicon atoms. As such, plasma 940 induced in the chamber 910 can sputter the silicon atoms of the electrode 950, and cause these sputtered silicon atoms to re-deposit over a top surface of the workpiece (e.g., to form the silicon layers 510 and 520). In some embodiments, a sputtering gas of the plasma 940 includes argon, or other suitable inert gases. Further, to stabilize the plasma 940, the electrode 950 may be electrically tied to a DC bias (e.g., a DC voltage, a DC current), which is sometimes referred to as DC superposition plasma.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for forming a semiconductor device, comprising:
   forming a photomask layer disposed on a dielectric material, wherein the photomask layer comprises a polymer layer;
   partially etching the polymer layer to form a first opening;
   overlaying sidewalls of the first opening with a first silicon layer; and
   further etching the polymer layer, with the first silicon layer serving as a mask, to extend the first opening to form a second opening.

2. The method of claim 1, further comprising:
   etching the dielectric material through the second opening; and
   removing respective remaining portions of the photomask layer and the first silicon layer.

3. The method of claim 1, wherein the step of overlaying sidewalls of the first opening with a first silicon layer further comprises:
   sputtering, through plasma, an electrode of a chamber to generate a plurality of sputtered silicon atoms; and
   re-depositing at least some of the plurality of sputtered silicon atoms over the first opening to form the first silicon layer.

4. The method of claim 3, wherein the plasma includes argon plasma.

5. The method of claim 3, wherein the electrode comprises silicon.

6. The method of claim 3, wherein the electrode is electrically connected to a DC bias.

7. The method of claim 1, further comprising:
   partially etching the polymer layer to form a third opening;
   overlaying sidewalls of the third opening with a second silicon layer, wherein the first silicon layer has a first thickness while the second silicon layer has a second, different thickness; and
   further etching the polymer layer, with the second silicon layer serving as a mask, to extend the third opening to form a fourth opening.

8. The method of claim 7, wherein the first opening has a first width and the third opening has a second width, the first width being greater than the second width.

9. The method of claim 8, wherein the first thickness is greater than the second thickness.

10. A method for forming a semiconductor device, comprising:
    forming a photomask layer disposed on a dielectric material, wherein the photomask layer comprises a polymer layer;
    partially etching the polymer layer to form a first opening and a second opening, wherein the first opening has a first width while the second opening has a second width different than the first width;
    overlaying partial sidewalls of the first opening and partial sidewalls of the second opening with a first silicon layer and a second silicon layer, respectively, wherein the first silicon layer has a first thickness while the second silicon layer has a second thickness different than the first thickness; and further etching the polymer layer, with the first silicon layer and the second silicon layer serving as respective masks, to extend the first opening to form a third opening and extend the second opening to form a fourth opening.

11. The method of claim 10, wherein the step of overlaying partial sidewalls of the first opening and partial sidewalls of the second opening with a first silicon layer and a second silicon layer, respectively, comprises a Physical Vapor Deposition (PVD) process.

12. The method of claim 10, wherein the first width is wider than the second width, which causes the first thickness to be thicker than the second thickness.

13. The method of claim 10, further comprising:
etching the dielectric material through the third opening and fourth opening to form a first trench and a second trench, respectively; and
removing respective remaining portions of the photomask layer, the first silicon layer, and the second silicon layer.

14. The method of claim 13, further comprising:
filling the first trench and second trench with a metal material to form a first interconnect structure and a second interconnect structure, respectively.

15. The method of claim 10, wherein the step of overlaying partial sidewalls of the first opening and partial sidewalls of the second opening with a first silicon layer and a second silicon layer, respectively comprises:
sputtering, through plasma, an electrode of a chamber to generate a plurality of sputtered silicon atoms; and
re-depositing at least some of the plurality of sputtered silicon atoms over the first opening and the second opening to form the first silicon layer and the second silicon layer, respectively.

16. The method of claim 15, wherein the electrode comprises silicon.

17. The method of claim 15, wherein the electrode is electrically connected to a DC bias.

18. A method for forming a semiconductor device, comprising:
forming a photomask layer disposed on a dielectric material, wherein the photomask layer comprises a polymer layer and a patterned photoresist layer;
partially etching the polymer layer, with the patterned photoresist layer serving as a mask, thereby forming a first opening in the polymer layer;
overlaying sidewalls of the first opening with a first silicon layer; and
further etching the polymer layer, with the first silicon layer serving as a mask, to extend the first opening to form a second opening.

19. The method of claim 18, further comprising:
partially etching the polymer layer to form a third opening;
overlaying sidewalls of the third opening with a second silicon layer, wherein the first silicon layer has a first thickness while the second silicon layer has a second, different thickness; and
further etching the polymer layer, with the second silicon layer serving as a mask, to extend the third opening to form a fourth opening.

20. The method of claim 18, further comprising:
etching the dielectric material through the second opening; and
removing respective remaining portions of the photomask layer and the first silicon layer.

* * * * *